Figure 1:
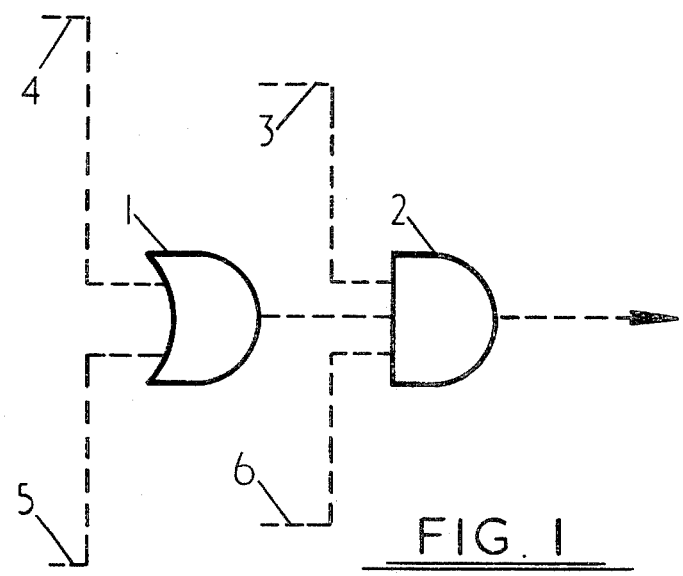

United States Patent [19]

Gargini

[11] 4,180,748
[45] Dec. 25, 1979

[54] ELECTRONIC SOLID STATE SWITCHING DEVICE

[75] Inventor: Eric J. Gargini, West Drayton, England

[73] Assignee: Communications Patents Limited, London, England

[21] Appl. No.: 844,466

[22] Filed: Oct. 21, 1977

[30] Foreign Application Priority Data

Nov. 10, 1976 [GB] United Kingdom ............... 46865/76

[51] Int. Cl.² .......................................... H03K 17/74
[52] U.S. Cl. .................................. 307/253; 307/254; 307/259
[58] Field of Search ............... 307/241, 243, 244, 253, 307/256, 259

[56] References Cited

U.S. PATENT DOCUMENTS

| 3,551,703 | 12/1970 | Bischoff | 307/259 |
| 3,665,220 | 5/1972 | Legler et al. | 307/256 |

Primary Examiner—Stanley D. Miller, Jr.
Assistant Examiner—B. P. Davis
Attorney, Agent, or Firm—Laurence R. Brown

[57] ABSTRACT

A switch is described comprising a diode directly connected to the base of a transistor, the diode, the transistor and the connection therebetween forming part of a signal path between input and output terminals of the switch, and a solid state device for selectively controlling the potential of the connection between the diode and the transistor to render both the diode and the transistor either conductive or non-conductive.

5 Claims, 2 Drawing Figures

ELECTRONIC SOLID STATE SWITCHING DEVICE

The present invention relates to switches, and in particular to switches for use in wired broadcasting systems in which subscribers are provided with controls for selecting any one of a plurality of programs.

In many wired broadcasting systems switching between programs is achieved by using reed switches. The costs of such reed switches and their control equipment have been rising whilst the costs of solid state devices generally have been falling. This has made the development of solid state switches desirable.

Our copending British Patent Application No. 41196/74 describes a switch comprising a pair of diodes connected in series with opposed polarities, and a solid state device for applying potentials to the connection between the diodes to render the diodes either conductive or non-conductive.

The switch described in our copending Application No. 41196/74 performs adequately but the isolation provided by the switch in its open condition (not passing signals) is not altogether satisfactory.

It is an object of the present invention to provide a switch which obviates or mitigates the above problem.

According to the present invention, there is provided a switch comprising a diode directly connected to the base of a transistor, the diode, the transistor and the connection therebetween forming part of a signal path between input and output terminals of the switch, and a solid state device for selectively controlling the potential of the connection between the diode and the transistor to render both the diode and the transistor either conductive or non-conductive.

The transistor is preferably one of a monolithic array of transistors, each transistor acting as a component of a respective switch.

Figure 2:
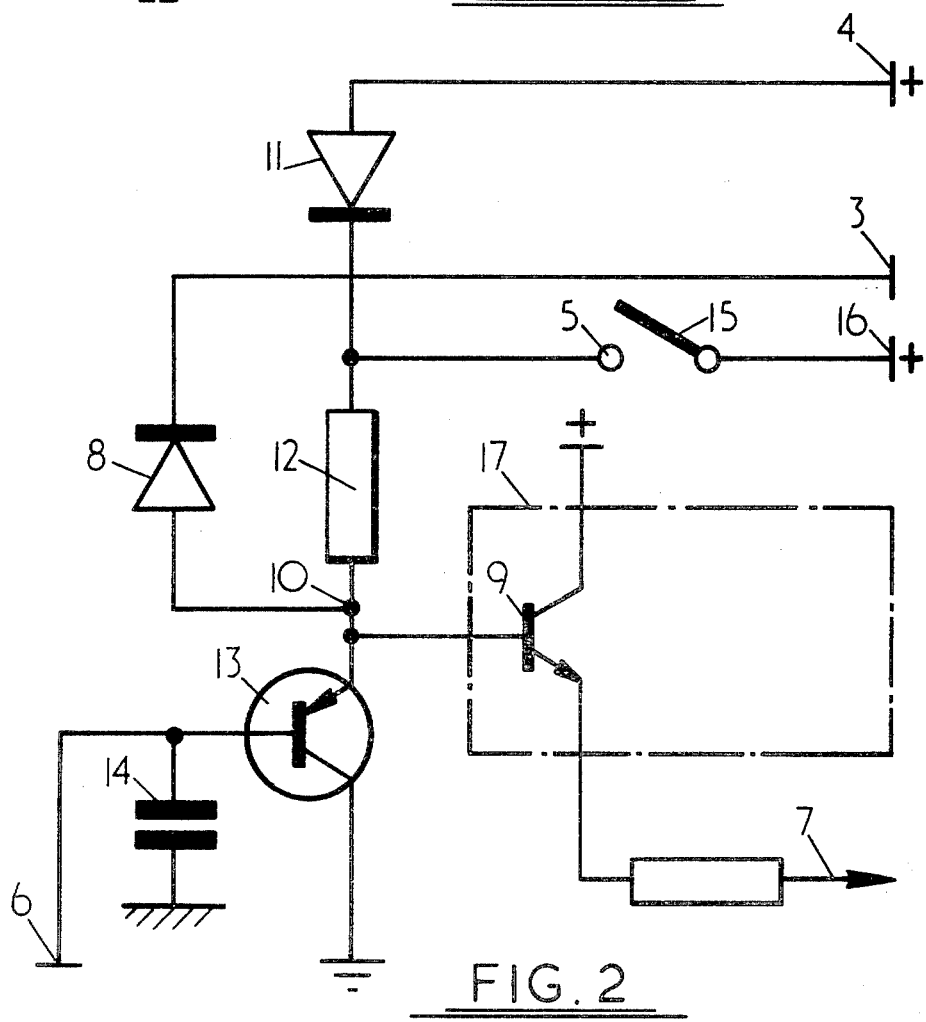

An embodiment of the present invention will now be described, by way of example, with reference to the accompanying drawings, in which:

FIG. 1 is a schematic diagram illustrating the function of a switch according to the invention; and FIG. 2 is a circuit diagram of a switch according to the invention and adapted to function in the same way as the switch of FIG. 1.

Referring to FIG. 1, the switch comprises an OR gate 1 and an AND gate 2, the AND gate 2 being controllable to either pass or stop an HF (high frequency) television signal applied to input 3.

The OR gate 1 has inputs 4 and 5. If neither of the inputs 4 and 5 receives an input signal, the AND gate stops the HF signal. The AND gate 2 receives a further control input 6 from a subscriber-controlled program selection device. The input 6 may be for example one output of a shift register controllable by dial pulses generated by a subscriber, each output of the shift register being connected to a respective AND gate 2. If input 6 does not receive an input signal, the gate 2 stops the HF signal.

Thus, the switch is controllable by the subscriber via input 6, and by the system operator via inputs 4 and 5. Normally input 4 would carry a signal, but if it were desired to deny the program appearing on input 3 to some subscribers, the signal on input 4 would be removed and a signal would be provided on input 5 for only those subscribers intended to receive the program.

Referring now to FIG. 2, equivalent inputs to 3, 4, 5 and 6 of FIG. 1 are shown with the same reference numerals. An HF television signal applied to signal busbar 3 is passed to output 7 via series connected diode 8 and transistor 9 only so long as the potential at point 10 is such as to forward bias diode 8 and turn on transistor 9. A positive potential is normally applied to denial busbar 4 connected to point 10 by diode 11 and resistor 12. A transistor 13 controlled by input 6 is also connected to point 10.

In the "OFF" condition of the switch, the transistor 13 has a zero or negative potential applied to its base, thereby rendering it conductive so that the potential at point 10 falls towards ground, turning off transistor 9 and thereby isolating output 7 from input 3. When a positive potential smoothed by capacitor 14 is applied to the base of transistor 13, it is biased "OFF" allowing the potential at point 10 to rise to the positive level on busbar 4. The diode 8 is then forward biased and transistor 9 conducts. Thus the switch is in the "ON" condition and signals appearing at input 3 are passed to output 7.

The output impedance of the transistor 13 is in shunt between the point 10 and ground. This arrangement improves the attenuation when transistor 13 conducts, i.e. when the switch is "OFF".

If it is decided that all subscribers are to be denied the program applied to input 3, the positive potential is removed from busbar 4. Whatever the condition of input 6, the diode 8 will not be forward biased, and the input 3 will be isolated from the output 7.

If it is desired to allow selected subscribers to receive an otherwise denied program, the positive potential is again removed from busbar 4. In addition however the switch of each subscriber who is to receive the program is enabled by closing switch 15 which is connected to a positive auxiliary supply 16. The enabled subscribers switches then operate normally as if busbar 4 carried the positive potential. The diode 11 prevents the positive potential from supply 16 reaching busbar 4.

The transistor 9 forms one element of a six transistor array 17, the other transistors of the array 17 forming equivalent component parts 9 for switches controlling other programs.

In the switch described in our copending application No. 41196/74 a diode takes the place of the transistor 9. This results in a "T" attenuator having an isolation inferior to the two section L network described herein.

The switch 15 may be a manual switch provided at a program distribution centre, normally referred to as a program exchange. Alternatively for example the switch 15 could be remotely controlled from the respective subscribers premises. This could be useful where a particular program is denied until subscriber indicates acceptance of a charge for that program.

What is claimed is:

1. A solid state switching circuit comprising in combination, a diode, an output transistor with base and collector and emitter, a signal path input terminal directly connected at a junction to the base of said transistor through the diode, an ouput terminal of the switching circuit connected to the emitter of said transistor, and a solid state device connected for selectively controlling the potential of the connection junction between the diode and the transistor in an operating mode to render both the diode and the transistor simultaneously either conductive or non-conductive, with the switching circuit exhibiting a very high off impedance to the input circuit means by serial connection solely through said diode and the transistor base impedance, and a very low on impedance to the transistor base when the diode is conducting.

2. A switch according to claim 1, wherein the said connection is normally connected to a source of potential via a resistor such that when the solid state device is non-conductive the diode and the transistor are both conductive.

3. A switch according to claim 1, comprising means for selectively connecting the said connection to an auxiliary source of potential via said resistor.

4. A switch according to claim 1, wherein the solid state device comprises a further transistor with base and collector and emitter and means connecting a switching control signal to the base, the output emitter-collector impedance of the further transistor being connected in shunt directly between the said connection junction and a source of fixed potential.

5. A switch according to claim 4, wherein a smoothing capacitor is connected in shunt with the base of the further transistor.